United States Patent
He et al.

(10) Patent No.: US 10,553,536 B2
(45) Date of Patent: Feb. 4, 2020

(54) METHOD OF MANUFACTURING AN INTERCONNECT STRUCTURE BY FORMING METAL LAYERS IN MASK OPENINGS

(71) Applicants: SEMICONDUCTOR MANUFACTURING INTERNATIONAL (SHANGHAI) CORPORATION, Shanghai (CN); NINGBO SEMICONDUCTOR INTERNATIONAL CORPORATION, Ningbo (CN)

(72) Inventors: Zuopeng He, Shanghai (CN); Ji Guang Zhu, Shanghai (CN)

(73) Assignees: SEMICONDUCTOR MANUFACTURING INTERNATIONAL (SHANGHAI) CORPORATION, Shanghai (CN); NINGBO SEMICONDUCTOR INTERNATIONAL CORPORATION, Ningbo (CN)

( * ) Notice: Subject to any disclaimer, the term of this patent is extended or adjusted under 35 U.S.C. 154(b) by 0 days.

(21) Appl. No.: 15/716,261

(22) Filed: Sep. 26, 2017

(65) Prior Publication Data

US 2018/0151488 A1    May 31, 2018

(30) Foreign Application Priority Data

Nov. 29, 2016  (CN) .......................... 2016 1 1066883

(51) Int. Cl.
*H01L 23/528* (2006.01)
*H01L 21/768* (2006.01)
(Continued)

(52) U.S. Cl.
CPC ...... *H01L 23/528* (2013.01); *H01L 21/76846* (2013.01); *H01L 21/76871* (2013.01);
(Continued)

(58) Field of Classification Search
CPC .......................... H01L 21/76807–76813; H01L 2221/1015–1036;
(Continued)

(56) References Cited

U.S. PATENT DOCUMENTS 5,840,625 A * 11/1998 Feldner ............. H01L 21/76807
438/626
5,920,790 A *  7/1999 Wetzel ............. H01L 21/76808
438/618

(Continued)

FOREIGN PATENT DOCUMENTS

EP         1737037        12/2006

OTHER PUBLICATIONS

Jaeger, Richard C., "Introduction to Microelectronic Fabrication", Addison-Wesley Publishing Company, ISBN 0-201-14695-9, pp. 18-21, reprinted May 1993.*

(Continued)

*Primary Examiner* — Younes Boulghassoul
(74) *Attorney, Agent, or Firm* — Anova Law Group, PLLC (57) ABSTRACT

A method for manufacturing an interconnect structure includes providing a substrate structure including a substrate and a first dielectric layer on the substrate and having an opening for a first interconnect layer extending to the substrate, forming a first mask layer on a portion of the first dielectric layer spaced apart from the opening, forming a first metal layer filling the opening and covering a portion of the first dielectric layer not covered by the first mask layer, removing the first mask layer, forming a second dielectric (Continued)

layer on the first dielectric layer and on the first metal layer and having a trench for a second interconnect layer, the trench exposing a portion of the first metal layer; and forming a second metal layer filling the trench and in contact with the exposed portion of the first metal layer.

16 Claims, 7 Drawing Sheets

(51) Int. Cl.
*H01L 23/522* (2006.01)
*H01L 23/532* (2006.01)
*H01L 21/32* (2006.01)
*H01L 21/3205* (2006.01)
*H01L 21/321* (2006.01)

(52) U.S. Cl.
CPC .. *H01L 21/76877* (2013.01); *H01L 21/76897* (2013.01); *H01L 23/5226* (2013.01); *H01L 23/5283* (2013.01); *H01L 23/53238* (2013.01); *H01L 21/32* (2013.01); *H01L 21/32051* (2013.01); *H01L 21/32115* (2013.01)

(58) Field of Classification Search
CPC ....... H01L 21/76877–76883; H01L 21/76885; H01L 21/76897; H01L 23/528; H01L 23/5283; H01L 23/5226; H01L 21/76843–76849; H01L 21/7685–76852; H01L 21/76865; H01L 23/53228–53238; H01L 21/32; H01L 21/027–0338; H01L 21/312–3128; H01L 21/32139; H01L 21/76802–76816; H01L 23/53295
See application file for complete search history.

(56) References Cited

U.S. PATENT DOCUMENTS

| | | | |
|---|---|---|---|
| 6,028,362 A * | 2/2000 | Omura | H01L 21/76807 257/751 |
| 6,352,917 B1 | 3/2002 | Gupta et al. | |
| 6,359,328 B1 * | 3/2002 | Dubin | H01L 21/288 257/622 |
| 6,426,558 B1 * | 7/2002 | Chapple-Sokol | H01L 21/76801 257/758 |
| 6,670,271 B1 * | 12/2003 | Subramanian | H01L 21/288 257/E21.174 |
| 9,412,648 B1 * | 8/2016 | Shiu | H01L 21/76811 |
| 2005/0153505 A1 * | 7/2005 | Gambino | H01L 21/76811 438/233 |
| 2006/0291029 A1 * | 12/2006 | Lin | H01L 21/2885 257/622 |
| 2006/0292851 A1 * | 12/2006 | Lin | H01L 21/76801 438/618 |
| 2012/0319278 A1 * | 12/2012 | Lin | H01L 21/76885 257/751 |
| 2012/0329272 A1 * | 12/2012 | Arnold | H01L 21/0273 438/653 |
| 2013/0127584 A1 * | 5/2013 | Filippi | G11C 29/702 337/297 |
| 2014/0035142 A1 * | 2/2014 | Yang | H01L 23/528 257/751 |
| 2017/0170110 A1 * | 6/2017 | Chang | H01L 21/76808 |

OTHER PUBLICATIONS

European Application No. 17203759.0, Extended European Search Report dated May 3, 2018, 9 pages.

* cited by examiner

METHOD OF MANUFACTURING AN INTERCONNECT STRUCTURE BY FORMING METAL LAYERS IN MASK OPENINGS

CROSS-REFERENCES TO RELATED APPLICATIONS

The present application claims priority to Chinese patent application No. 201611066883.1, filed with the State Intellectual Property Office of People's Republic of China on Nov. 29, 2016, the content of which is incorporated herein by reference in its entirety.

FIELD OF THE INVENTION

The present invention relates to semiconductor technology, and more particularly to an interconnect structure and a method for manufacturing the same.

BACKGROUND OF THE INVENTION

For reducing device feature sizes, current techniques generally employ Damascene processes for forming an interconnect structure. A conventional process of manufacturing an interconnect structure may include the steps of first forming an opening in a dielectric layer on a substrate, and then depositing a barrier layer and a seed layer on the surface of the dielectric layer and on the surface of the opening. Thereafter, a metal layer is deposited using an electroplating process to fill the opening and to cover the seed layer on the dielectric layer, and then a planarization process is performed on the deposited metal layer.

BRIEF SUMMARY OF THE INVENTION

The present inventors have discovered that the rate of electroplating of the metal layer from the bottom to the top of the opening is relatively slow, thus, for filling the opening the amount of the metal to be deposited on the entire substrate is relatively large. For example, in an integrated passive device (IPD) fabrication process, the conductive structure is relatively large and requires a thick metal layer to fill the opening of the interconnect structure. The thick metal layer will exert a high stress in the interconnect structure. In addition, the high stress causes warping or even breakage in the substrate. Furthermore, a thick deposited metal layer will increase the cost of metal deposition and the cost of a subsequent planarization of the deposited metal layer.

Thus, the present inventors provide a novel method for manufacturing an interconnect structure having reduced stress and improved reliability. The method may include providing a substrate structure including a substrate and a first dielectric layer on the substrate. The first dielectric layer includes an opening for a first interconnect layer extending to the substrate. The method may also include forming a first mask layer on a portion of the first dielectric layer spaced apart from the opening, forming a first metal layer filling the opening and covering a portion of the first dielectric layer not covered by the first mask layer, removing the first mask layer exposing a portion of the first dielectric layer, and forming a second dielectric layer on the exposed portion of the first dielectric layer and on the first metal layer. The method may further include removing a portion of the second dielectric layer to form a trench for a second interconnect layer, the trench exposing a portion of the first metal layer, and forming a second metal layer filling the trench and in contact with the exposed portion of the first metal layer.

In one embodiment, forming the second metal layer in the trench includes forming a second mask layer on a portion of a remaining second dielectric layer (i.e., the remaining second dielectric layer is the second dielectric layer having a portion being removed to form the trench), forming the second metal layer covering the trench, planarizing the second metal layer until an upper surface of the second metal layer is substantially flush with an upper surface of the remaining second dielectric layer.

In one embodiment, the method may further include, prior to forming the second mask layer, forming a second barrier layer on the remaining second dielectric layer, and on a bottom and sidewalls of the trench, the second mask layer is disposed on the second barrier layer.

In one embodiment, the method may further include, prior to forming the second mask layer, forming a second barrier layer on the remaining second dielectric layer, and on a bottom and sidewalls of the trench, and forming a second seed layer on the second barrier layer. The second mask layer is disposed on the second seed layer.

In one embodiment, each of the first mask layer and the second mask layer includes a photoresist.

In one embodiment, forming the second metal layer filling the trench includes forming the second metal layer covering a remaining second dielectric layer, planarizing the second metal layer until an upper surface of the second metal layer is substantially flush with an upper surface of the remaining second dielectric layer.

In one embodiment, the method may further include, prior to forming the first mask layer, forming a first barrier layer on the substrate structure, the first mask layer being disposed on the first barrier layer; and after removing the first mask layer, removing an exposed portion of the first barrier layer.

In one embodiment, the method may further include, prior to forming the first mask layer, forming a first barrier layer on the substrate structure, forming a first seed layer on the first barrier layer, the first mask layer being disposed on the first seed layer, and after removing the first mask layer, removing an exposed portion of the first seed layer and exposed portion of the first barrier layer.

In one embodiment, forming the first metal layer includes an electro-plating process, and forming the second metal layer includes an electro-plating process.

In one embodiment, each of the first metal layer and the second metal layer includes copper.

In one embodiment, the opening includes a groove extending into the first dielectric layer and at least one through hole below the groove.

Embodiments of the present invention also provide an interconnect structure. The interconnect structure includes a substrate, a first dielectric layer on the substrate and having an opening for a first interconnect layer extending to the substrate, a first metal layer having a first portion in the opening and a second portion in contact with the first portion and on a portion of the first dielectric layer adjacent to the opening, a second dielectric layer on the first dielectric layer and on the first metal layer, the second dielectric layer including a trench for a second interconnect layer, the trench exposing the second portion of the first metal layer, and a second metal layer filling the trench. The second portion of the first metal layer forms a lower portion of the second interconnect layer.

In one embodiment, the interconnect structure further includes a first barrier layer on a bottom and sidewalls of the opening.

In one embodiment, the interconnect structure further includes a first seed layer disposed between the first barrier layer and the first metal layer.

In one embodiment, the interconnect structure further includes a second barrier layer on a bottom and sidewalls of the trench.

In one embodiment, the interconnect structure further includes a second seed layer disposed between the second barrier layer and the second metal layer.

In one embodiment, the first and second metal layers each include copper. In one embodiment, the opening includes a groove and one or more through holes below the groove The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. In the drawings, like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably. The terms "substrate" and "wafer" are used interchangeably.

It should be noted that like reference numerals are used to denote like elements, and once an element has been defined in a drawings, it will not be further described in other drawings.

Embodiments of the present invention now will be described more fully hereinafter with reference to the accompanying drawings, in which embodiments of the invention are shown. This invention may, however, be embodied in many different forms and should not be construed as limited to the embodiments set forth herein.

To solve the stress problems in current interconnect structures, the inventors propose a novel method that does not blanket deposit a metal layer on the entire surface of the substrate, i.e., the method shields some portions of the substrate from the deposited metal layer, so that the amount of the deposited metal layer is reduced, thereby reducing the stress in the deposited metal layer.

Figure 1:
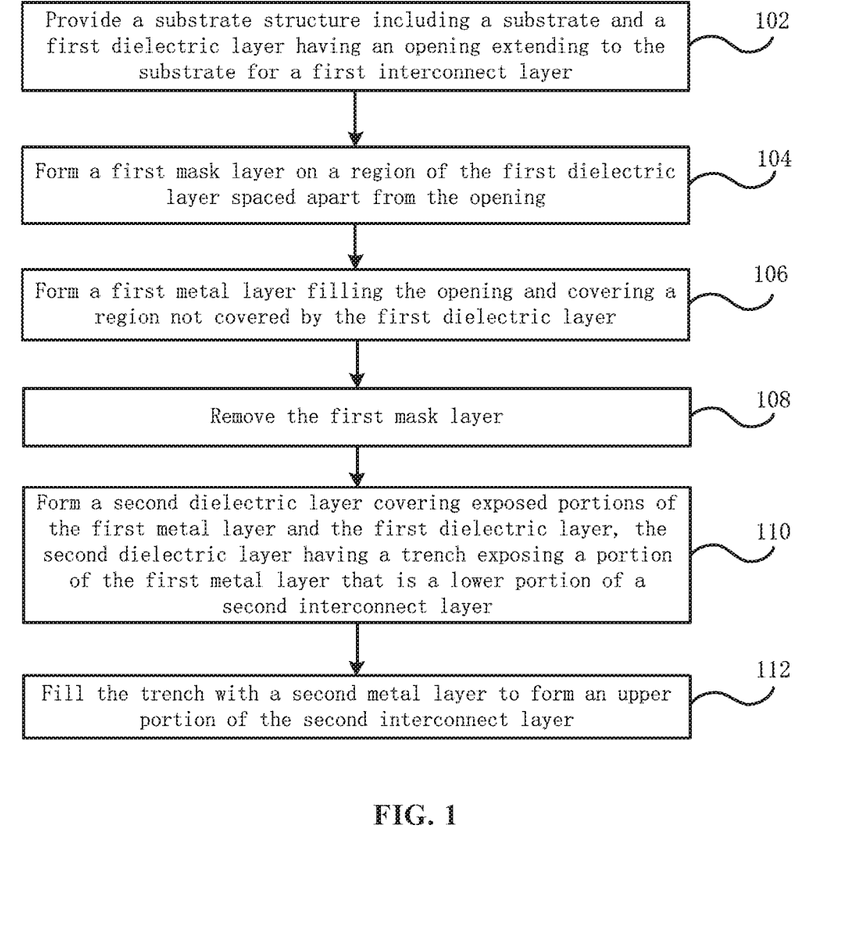
FIG. 1 is a simplified flowchart of a method for manufacturing an interconnect structure according to an embodiment of the present invention.

FIG. 1 is a simplified flowchart of a method for manufacturing an interconnect structure according to an embodiment of the present invention. FIGS. 2 to 11 are cross-sectional views illustrating intermediate stages of an interconnect structure in a manufacturing method according to an embodiment of the present invention. A method for manufacturing an interconnect structure according to an embodiment of the present invention will be described below with reference to FIGS. 1 and 2 to 11.

Figure 2:
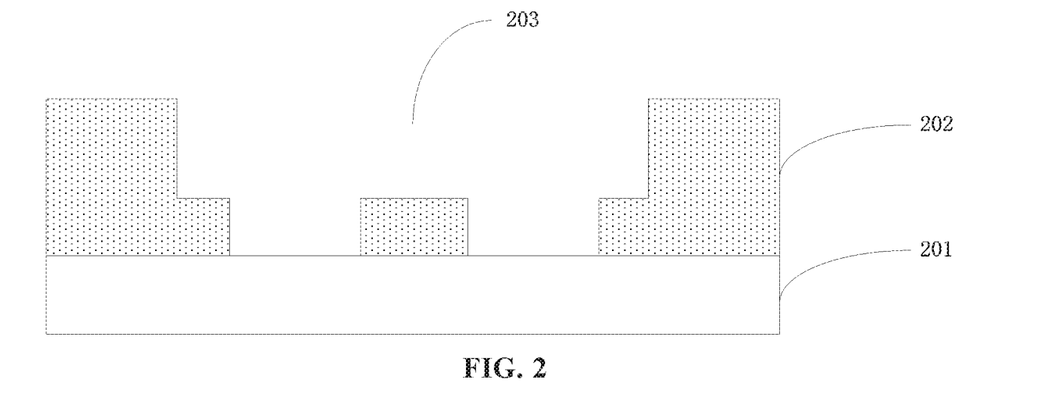
FIGS. 2 to 10, and FIGS. 11A-11B are cross-sectional views illustrating intermediate stages of an interconnect structure in a manufacturing method according to an embodiment of the present invention.

Referring to FIG. 1, a substrate structure is provided in step 102. Referring to FIG. 2, the substrate structure may include a substrate 201 and a dielectric layer 202 on substrate 201. Dielectric layer 202 includes an opening 203 for a first interconnect layer extending to substrate 201. Substrate 201 may include a variety of different devices, such as metal oxide semiconductor (MOS) devices, passive devices (e.g., capacitors, inductors, and the like), etc. Substrate 201 may include a semiconductor layer (e.g., silicon, germanium, gallium arsenide, and the like) and a device layer on the semiconductor layer. In one embodiment, opening 203 may include a groove extending into first dielectric layer 202 and a via disposed below the groove and extending to substrate 201. In some embodiments, the via may include one, two, or more through holes. It should be noted that opening 203 can be formed using conventional damascene processes that are compatible with existing semiconductor fabrication processes and will not be described herein for the sake of brevity.

Figure 3:
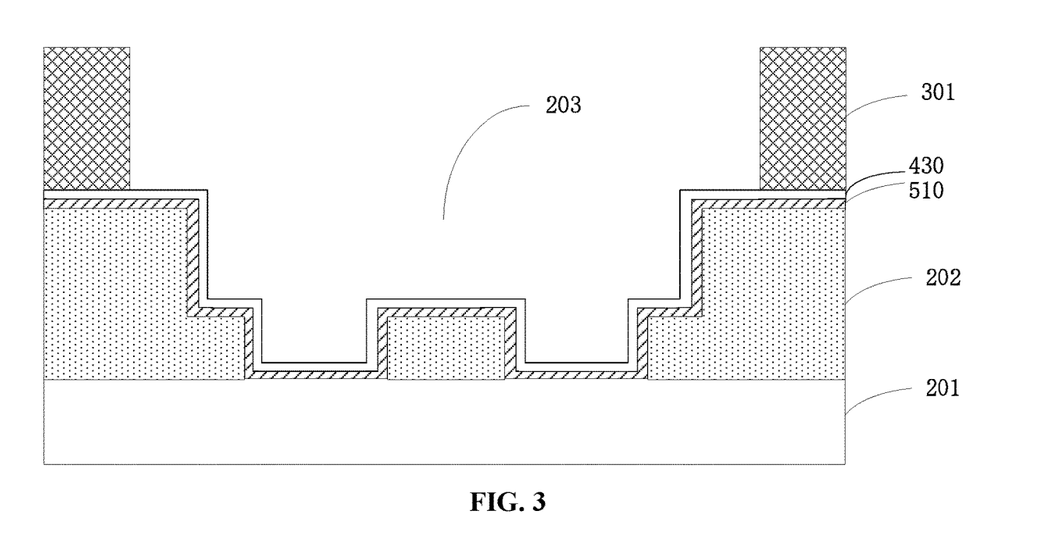

Next, in step 104, a first mask layer 301 (e.g., a photoresist) is formed on a region of first dielectric layer 202 spaced apart from the opening, as shown in FIG. 3.

In one embodiment, prior to forming first mask layer 301 on a region of first dielectric layer 202 spaced apart from opening 203, a first barrier layer 510 may be formed on the substrate structure shown in FIG. 2. First mask layer 301 is formed on the first barrier layer 510. The first barrier layer 510 is formed on the bottom and sidewalls of opening 203 and on the surface of first dielectric layer 202. In one embodiment, the first barrier layer 510 may include TaN, Ta, or stacked layers of TaN and Ta. In a specific embodiment, the method may also include forming a first seed layer 430 on the first barrier layer 510, so that the first mask layer 301 is formed on the first seed layer 430. The first seed layer 430 may include copper. The first barrier layer 510 and the first seed layer 430 each may be formed using a physical vapor deposition (PVD) process.

Figure 4:
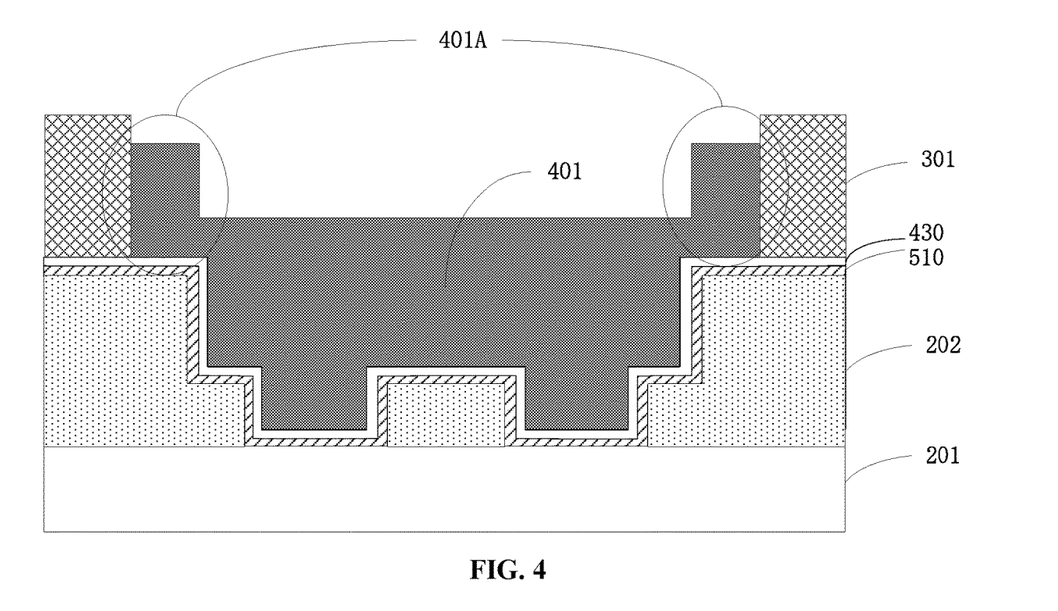

Next, in step 106, a first metal layer (e.g., copper) 401 is formed filling opening 401 and covering the surface area of first dielectric layer 202 not covered by first mask layer 301, as shown in FIG. 4. In one embodiment, first metal layer 401 may be deposited using an electroplating process.

In the embodiment, first metal layer 401 filling opening 204 forms a first interconnect layer. The first interconnect layer includes a lower portion formed of a via filled with the first metal layer and an upper portion formed of a groove filled with the first metal layer. The region of first dielectric layer 202 not covered by first mask layer 301 includes a step-shaped structure. First metal layer 401 is conformally deposited on the step-shaped structure to form a conformal region 401A, which is indicated by a circle. Conformal region 401A is adjacent to first mask layer 301. In the embodiment, conformal region 401A of the first metal layer adjacent to first mask layer 301 may serve as a lower portion of a second interconnect layer, which is typically formed later by filling a via of the second interconnect layer. Since first mask layer 301 covers a portion of first dielectric layer 202, the amount of electro-plated first metal layer 401 is substantially reduced with respect to the amount of a metal layer that is blanket formed on the dielectric layer, thereby reducing the stress in a subsequently formed interconnect structure, reducing the manufacturing cost, and improving the reliability of the interconnect structure.

Figure 5:
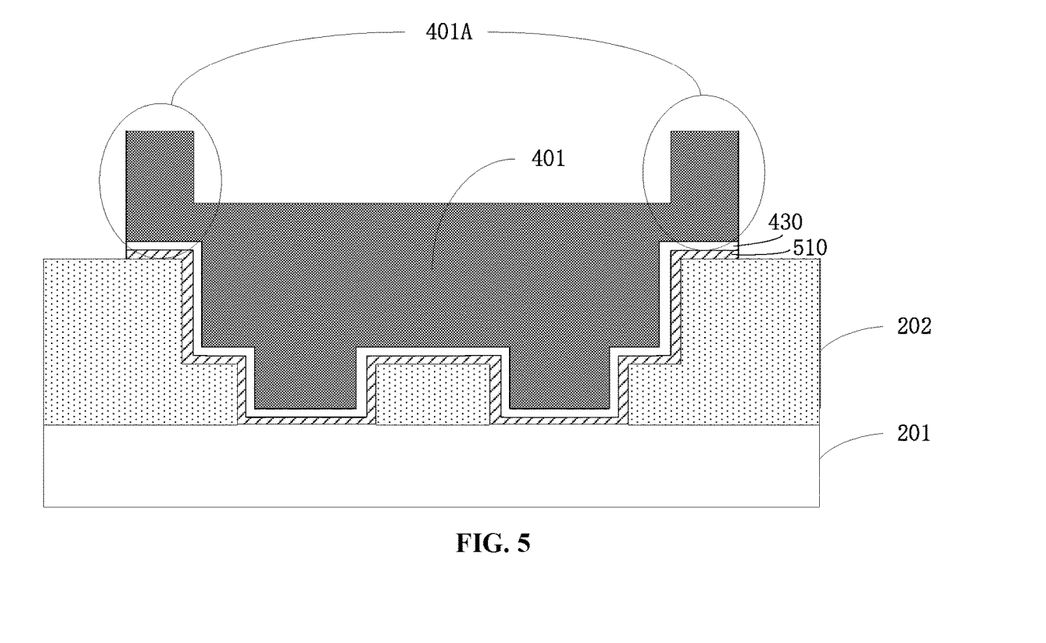

Next, in step 108, first mask layer 301 is removed exposing a portion of first dielectric layer 202, as shown in FIG. 5. It should be noted that, in the case where a seed layer and/or a first barrier layer are formed below first mask layer 301, the exposed portions of the first seed layer and the first barrier layers are also removed after the removal of first mask layer 301.

Next, in step 110, a second dielectric layer 601 is formed covering the exposed portions of first metal layer 401 and first dielectric layer 202. The second dielectric layer 601 includes a trench 701 for a second interconnect layer exposing a portion of conformal region 401A, conformal region 401A serves as a lower portion of a second interconnect layer.

Figure 6:
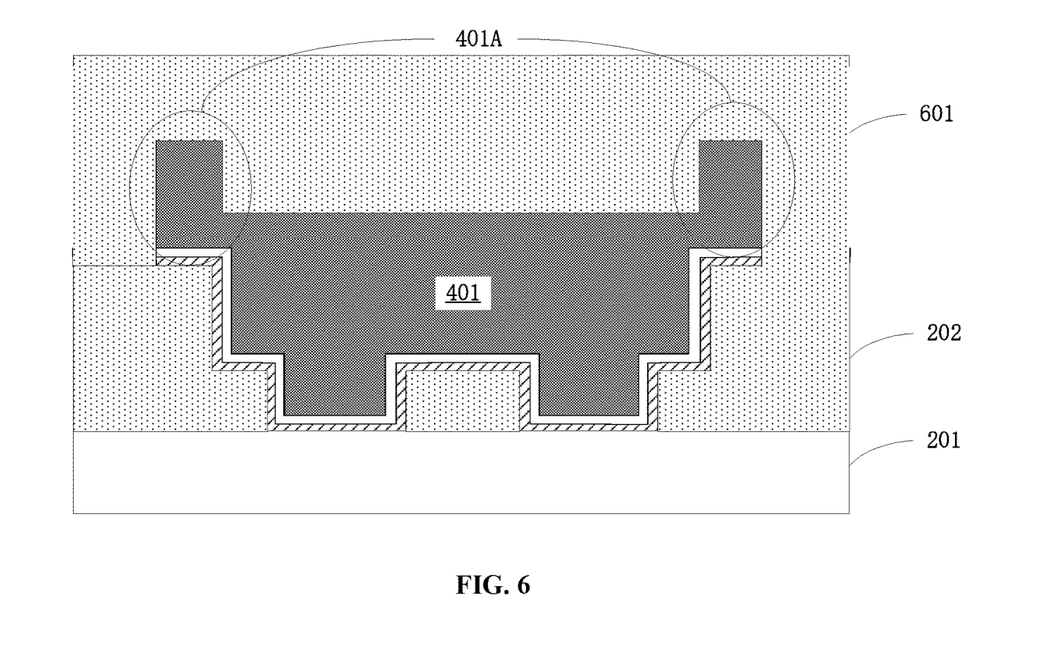

In one embodiment, referring to FIG. 6, deposited second dielectric layer 601 covers the exposed portions of first metal layer 401 and first dielectric layer 202. In one embodiment, second dielectric layer 601 may include silicon oxide, silicon nitride, or the like. Second dielectric layer 601 may be of the same material as or different material from first dielectric layer 202.

Figure 7:
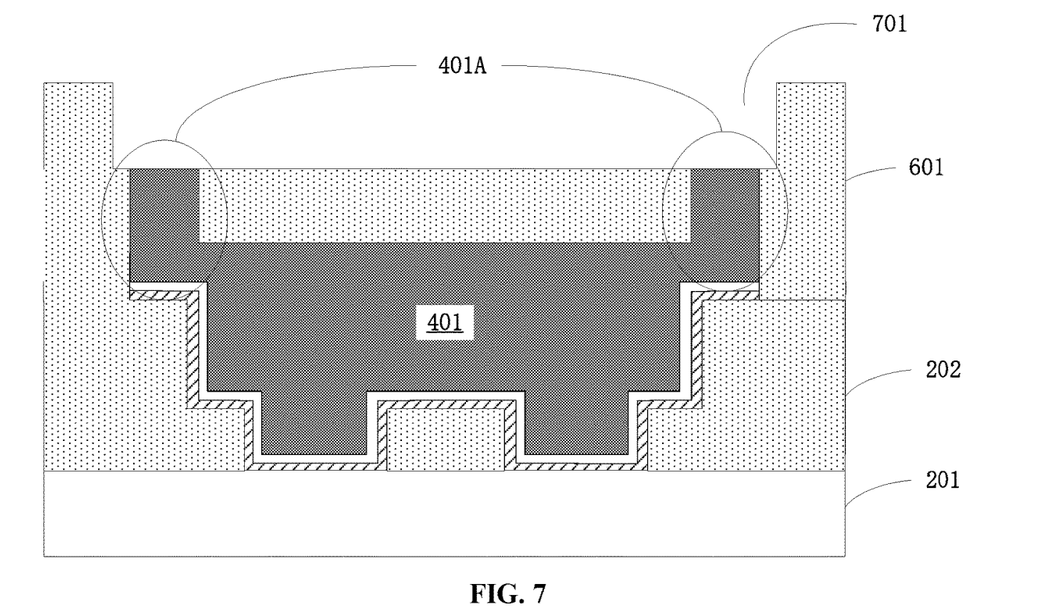

Next, referring to FIG. 7, second dielectric layer 601 is etched to form a trench 701 for a second interconnect layer. In one embodiment, a patterned hardmask layer may be formed on second dielectric layer 601 defining the shape of trench 701, an etch process is performed on second dielectric layer 601 using the patterned hardmask layer as a mask to form trench 701. Trench 701 exposes a surface of portion 401A of first metal layer 401. Thereafter, the patterned hardmask layer is removed.

Next, in step 112, the method further includes forming a second metal layer (e.g., copper) filling trench 701 to form an upper portion of the second interconnect layer. In one embodiment, the second metal layer may be deposited using an electroplating process to fill trench 701.

In one embodiment, the upper portion of the second interconnect layer may be formed by first depositing a second metal layer filling the trench and covering a remaining second dielectric layer (the remaining second dielectric layer is the second dielectric layer having a portion removed to form the trench). A planarization process is then performed until the upper surface of the remaining second metal layer is substantially flush with the upper surface of the second dielectric layer. Note that in this context, the term "substantially flush" refers to that the lateral surfaces are flush (coplanar) with each other within the range of process variation.

In another embodiment, the upper portion of the second interconnect layer may be formed with reference to FIGS. 8 through 11.

Figure 8:
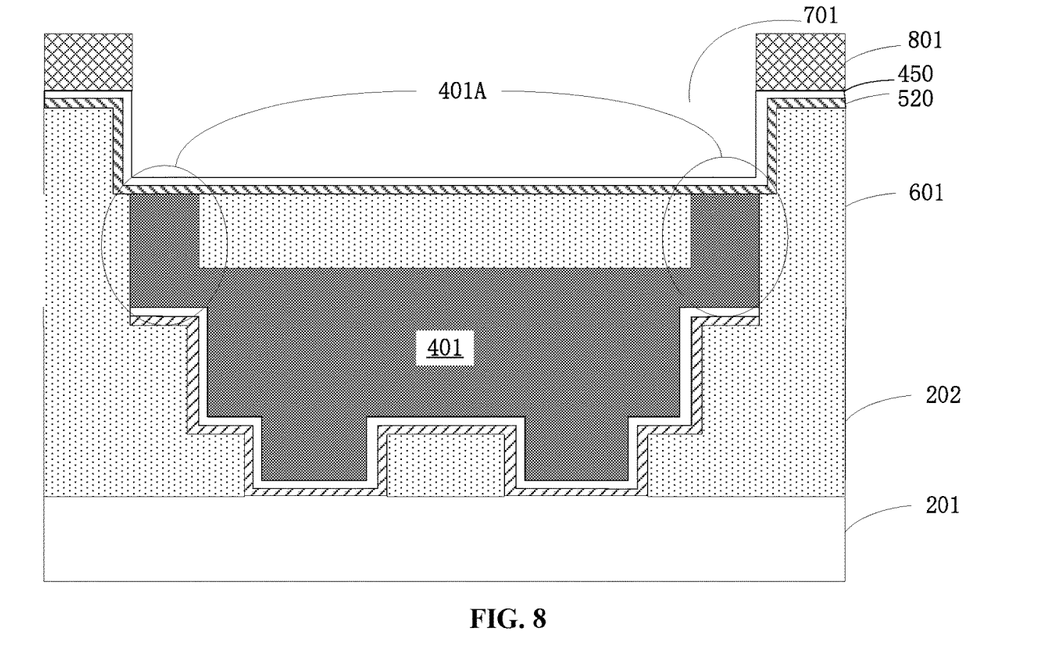

Referring to FIG. 8, a second mask layer 801 (e.g., a photoresist) is formed on a portion of remaining second dielectric layer 601. In one embodiment, prior to forming second mask layer 801 on a portion of remaining second dielectric layer 601, the method may include forming a second barrier layer 520 on remaining second dielectric layer 601, and on the bottom and sidewalls of trench 701, such that second mask layer 801 is formed on the second barrier layer 520. In one embodiment, the second barrier layer 520 may include TaN, Ta, or stacked layers of TaN and Ta. In a specific embodiment, the method may also include forming a second seed layer 450 on the second barrier layer 520, so that second mask layer 801 is formed on the second seed layer 450. The second seed layer 450 may include copper. Similar to the first barrier and seed layers, the second barrier layer 520 and the second seed layer 450 each may be formed using a physical vapor deposition (PVD) process.

Figure 9:
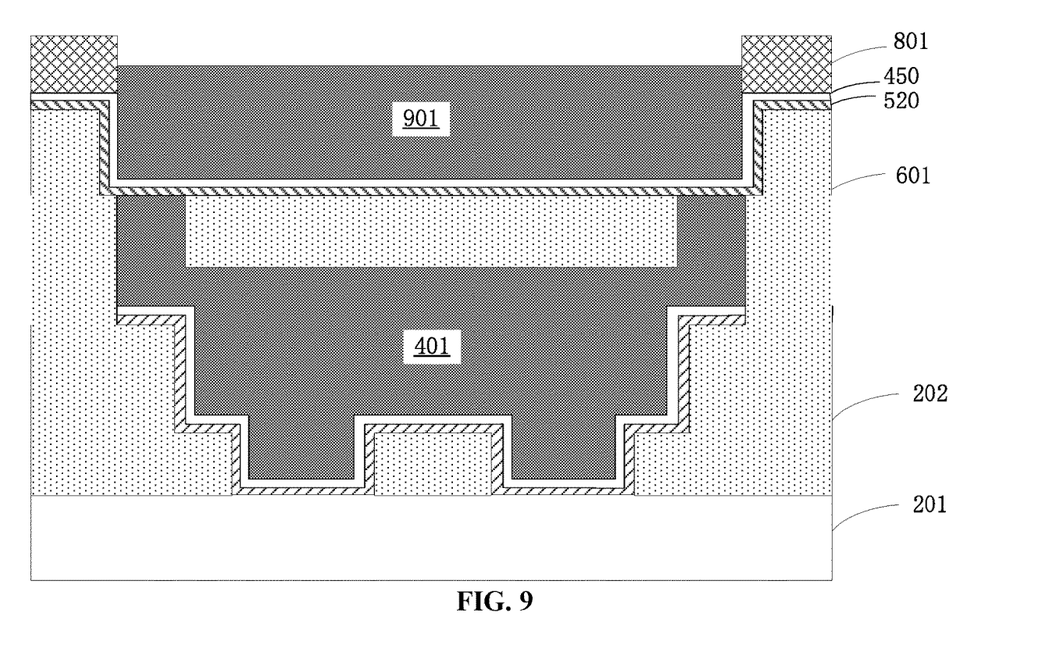

Referring to FIG. 9, the method includes depositing a second metal layer 901 filling trench 701. Since second mask layer 801 is formed on at least one portion of remaining dielectric layer 601, the amount of deposited second metal layer 901 is reduced, further reducing the stress of the second interconnect layer, facilitating a subsequent planarization process, and reducing the cost of the planarization process.

Figure 10:
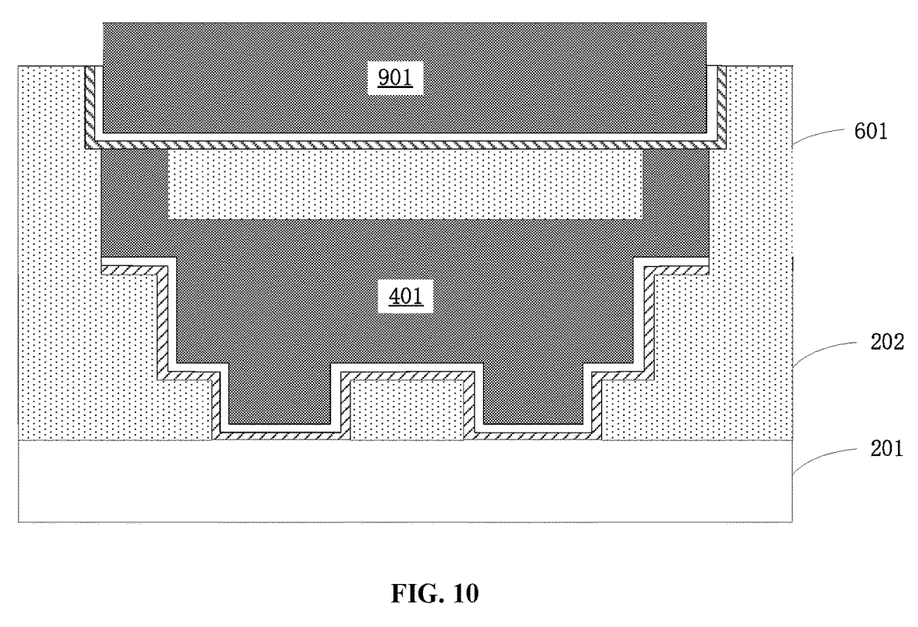

Referring to FIG. 10, second mask layer 801 is removed. It is noted that in the case where a second seed layer and/or a second barrier layer are formed below second mask layer 801, after the removal of second mask layer 801, exposed portions of the second seed layer and the second barrier layer are also removed.

Figure 11A:
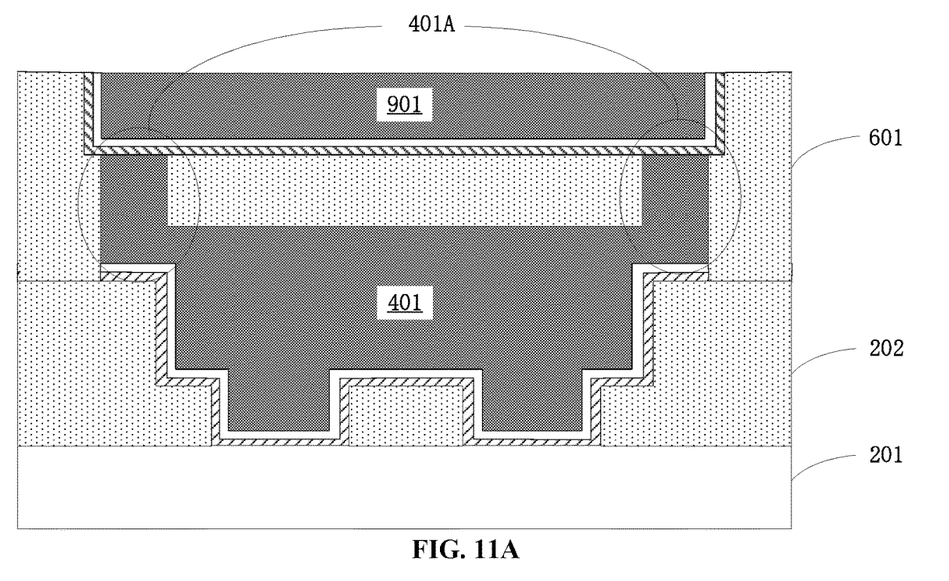
Figure 11B:
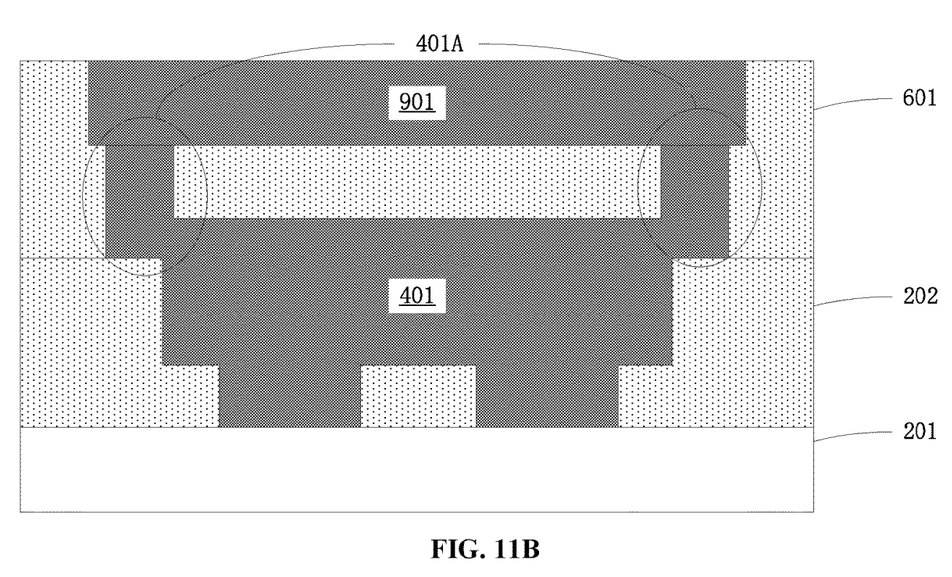

Referring to FIGS. 11A-11B a planarization process is performed on second metal layer 901, so that the upper surface of a remaining second metal layer 901 is substantially flush with the upper surface of second dielectric layer 601.

In accordance with the present invention, the method of manufacturing an interconnect structure provides forming a first mask layer on a portion of the first dielectric layer to reduce an amount of a first metal layer subsequently deposited on the first dielectric layer, thereby saving process costs, reducing the stress in the first metal layer, and reducing the stress in the first interconnect layer, so that the reliability and stability of the interconnect structure will be improved. In addition, a lower portion of a second interconnect layer may also be formed at the same time when the first metal layer is deposited, thus eliminating the need for photolithography and etch processes when forming through holes of the second interconnect structure to reduce process costs. As used herein, portion 401A of first metal layer 401 is the lower portion of the second interconnect layer.

The method of the present invention is particularly suitable for manufacturing integrated passive devices (IPD), but is not limited thereto.

Embodiments of the present invention also provide an interconnect structure. Referring to FIGS. 11A-11B, the interconnect structure includes a substrate 201, and a first dielectric layer 202 having an opening extending to substrate 201 and configured to be used for a first interconnect layer. In one embodiment, the opening may include a groove extending into the first dielectric layer and at least one through hole disposed below the groove.

The interconnect structure also includes a first metal layer 401 (e.g., copper) filling the opening and covering a portion of first dielectric layer 202 adjacent to the opening. A portion 401A of first metal layer 401 covering the portion of first dielectric layer adjacent to the opening adjacent is a lower portion of a second interconnect layer. In the embodiment, the portion of first metal layer 401 filling opening 203 is the first interconnect layer, and the lower portion of the second interconnect layer is integrally formed with the first interconnect layer. In one embodiment, the first metal layer has a first portion in the portion and a second portion in contact with the first portion and on a portion of the first dielectric layer adjacent to the opening.

The interconnect structure further includes a second dielectric layer 601 on first dielectric layer 202 and on first metal layer 401. Second dielectric layer 601 has a trench for the second interconnect layer. The trench in second dielectric layer 601 exposes an upper surface of lower portion 401A of the second interconnect layer.

The interconnect structure also includes a second metal layer 901 (e.g., copper) filling the trench.

In some embodiments, the interconnect structure may also include a first barrier layer 510 disposed on the bottom and sidewalls of the opening. The first metal layer is on the first barrier layer 510. In one embodiment, the interconnect structure may also include a first seed layer 430 disposed between the first barrier layer 510 and first metal layer 401, and the first metal layer is on the first seed layer 430.

In some embodiments, the interconnect structure may also include a second barrier layer 520 disposed on the bottom and sidewalls of the trench in second dielectric layer 601. In one embodiment, the interconnect structure may further include a second seed layer 450 disposed between the second barrier layer 520 and second metal layer 901.

In summary, embodiments of the present invention provide an interconnect structure and a manufacturing method thereof. In order not to obscure the teachings of the present invention, details of processes and structures known in the art are not described.

The foregoing descriptions of specific embodiments of the present invention have been presented for purpose of illustration and description. They are not intended to be exhaustive or to limit the invention to the precise forms disclosed, and obviously many modifications and variations are possible in light of the above disclosure. The exemplary embodiment has been described in order to best explain the principles of the invention and its practical applications. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for manufacturing an interconnect structure, the method comprising:
   providing a substrate structure including a substrate and a first dielectric layer on the substrate, the first dielectric layer having an opening for a first interconnect layer extending to the substrate underlying the first dielectric layer;
   forming a first mask layer on a first portion of the first dielectric layer spaced apart from the opening;
   forming a first metal layer filling the opening and covering the first dielectric layer uncovered by the first mask layer, wherein the first metal layer and the substrate together enclose a second portion of the first dielectric layer, and the second portion of the first dielectric layer has a top surface lower than the first portion of the first dielectric layer;
   removing the first mask layer and exposing the first portion of the first dielectric layer;
   forming a second dielectric layer on the exposed first portion of the first dielectric layer and on the first metal layer,
   removing a portion of the second dielectric layer to form a trench for a second interconnect layer in the second dielectric layer, the trench exposing a portion of the first metal layer;
   forming a second mask on the second dielectric layer; and
   forming a second metal layer filling the trench and in contact with the exposed portion of the first metal layer.

2. The method of claim 1, wherein forming the second metal layer in the trench comprises:
   forming the second mask layer on a portion of a remaining second dielectric layer;
   forming the second metal layer covering the trench; and
   planarizing the second metal layer until an upper surface of the second metal layer is substantially flush with an upper surface of the remaining second dielectric layer.

3. The method of claim 2, further comprising, prior to forming the second mask layer:
forming a second barrier layer on the remaining second dielectric layer, and on a bottom and sidewalls of the trench, the second mask layer is disposed on the second barrier layer.

4. The method of claim 2, further comprising prior to forming the second mask layer:
forming a second barrier layer on the remaining second dielectric layer, and on a bottom and sidewalls of the trench, and
forming a second seed layer on the second barrier layer, the second mask layer is disposed on the second seed layer.

5. The method of claim 2, wherein the first mask layer and the second mask layer each comprise a photoresist.

6. The method of claim 1, wherein forming the second metal layer filling the trench comprises:
forming the second metal layer covering a remaining second dielectric layer; and
planarizing the second metal layer until an upper surface of the second metal layer is substantially flush with an upper surface of the remaining second dielectric layer.

7. The method of claim 1, further comprising, prior to forming the first mask layer:
forming a first barrier layer on the substrate structure, the first mask layer being disposed on the first barrier layer; and
after removing the first mask layer, removing an exposed portion of the first barrier layer.

8. The method of claim 1, further comprising, prior to forming the first mask layer:
forming a first barrier layer on the substrate structure; and
forming a first seed layer on the first barrier layer, the first mask layer being disposed on the first seed layer; and
after removing the first mask layer, removing an exposed portion of the first seed layer and an exposed portion of the first barrier layer.

9. The method of claim 1, wherein forming the first metal layer comprises an electro-plating process, and forming the second metal layer comprises an electro-plating process.

10. The method of claim 1, wherein the first metal layer and the second metal layer each comprises copper.

11. The method of claim 1, wherein:
the opening comprises a groove extending into the first dielectric layer and one or more through holes below the groove, and
the first metal layer filling the opening is formed in the groove and in the one or more through holes below the groove.

12. The method of claim 1, wherein the first metal layer is formed such that the first dielectric layer has a top surface lower than the first metal layer.

13. The method of claim 1, wherein surface portions of the substrate exposed by the opening are separated by the second portion of the first dielectric layer.

14. The method of claim 1, wherein the first metal layer and the second metal layer together enclose a portion of the second dielectric layer.

15. The method of claim 1, wherein the first interconnect layer includes a damascene structure.

16. The method of claim 1, wherein:
the first metal layer includes a first portion in the opening and a second portion in contact with the first portion and on a third portion of the first dielectric layer adjacent to the opening; and
the second portion of the first metal layer forms a lower portion of the second interconnect layer.

* * * * *